United States Patent
Colosimo et al.

(10) Patent No.: US 11,615,972 B2
(45) Date of Patent: Mar. 28, 2023

(54) REUSABLE DIE CATCH MATERIALS, REUSABLE DIE RELEASE MATERIALS, RELATED DIE TRANSFER SYSTEMS, AND METHODS OF USING THE SAME

(71) Applicant: Kulicke & Soffa Netherlands B.V., Eindhoven (NL)

(72) Inventors: Thomas Colosimo, West Chester, PA (US); Tao-Hua Lee, North Wales, PA (US); Ting-Chia Huang, Philadelphia, PA (US)

(73) Assignee: Kulicke and Soffa Industries, Inc.

( * ) Notice: Subject to any disclaimer, the term of this patent is extended or adjusted under 35 U.S.C. 154(b) by 0 days.

(21) Appl. No.: 17/481,437

(22) Filed: Sep. 22, 2021

(65) Prior Publication Data

US 2022/0093423 A1    Mar. 24, 2022

Related U.S. Application Data

(60) Provisional application No. 63/081,522, filed on Sep. 22, 2020, provisional application No. 63/081,861, filed on Sep. 22, 2020.

(51) Int. Cl.
| | |
|---|---|
| *H01L 21/67* | (2006.01) |
| *H01L 25/075* | (2006.01) |
| *H01L 33/00* | (2010.01) |

(52) U.S. Cl.
CPC .. *H01L 21/67132* (2013.01); *H01L 21/67115* (2013.01); *H01L 25/0753* (2013.01); *H01L 33/005* (2013.01)

(58) Field of Classification Search
CPC . H01L 2221/68322; H01L 2221/68368; H01L 21/6835
See application file for complete search history.

(56) References Cited

U.S. PATENT DOCUMENTS

| | | | |
|---|---|---|---|
| 9,862,141 B2 | 1/2018 | Marinov et al. | |
| 10,748,802 B2 | 8/2020 | Marinov et al. | |
| 11,404,403 B2 * | 8/2022 | Chung | H01L 24/29 |
| 11,476,162 B2 * | 10/2022 | Holsteyns | H01L 23/481 |

(Continued)

FOREIGN PATENT DOCUMENTS

| | | |
|---|---|---|
| WO | 2020/168174 | 8/2020 |
| WO | 2020/252161 | 12/2020 |

(Continued)

OTHER PUBLICATIONS

International Search Report dated Jan. 28, 2022 for International Patent Application No. PCT/EP2021/025358.

*Primary Examiner* — Andrew J Coughlin
(74) *Attorney, Agent, or Firm* — Christopher M. Spletzer, Sr.

(57) ABSTRACT

A system for transfer of a plurality of die from a die source to a receive substrate is provided. The system includes a die source including a plurality of die, the plurality of die being coupled to a carrier. The system also includes a receive substrate to receive the plurality of die from the die source. The receive substrate includes a die catch material for receiving the plurality of die from the die source, the die catch material being reusable. The system also includes a laser source for providing energy to interact with a die release material to transfer the plurality of die from the die source to the receive substrate.

19 Claims, 20 Drawing Sheets

(56) References Cited

U.S. PATENT DOCUMENTS

| | | | |
|---|---|---|---|
| 2008/0122119 A1 | 5/2008 | Kian et al. | |
| 2011/0068452 A1 | 3/2011 | Kerr et al. | |
| 2013/0273695 A1* | 10/2013 | Menard | H01L 24/80 |
| | | | 438/118 |
| 2019/0057891 A1* | 2/2019 | Marinov | H01L 21/3065 |
| 2019/0304949 A1* | 10/2019 | Rusli | H01L 21/673 |
| 2020/0168498 A1 | 5/2020 | Marinov et al. | |
| 2020/0335383 A1* | 10/2020 | Hsu | H01L 21/67132 |

FOREIGN PATENT DOCUMENTS

| | | |
|---|---|---|
| WO | 2020/252164 | 12/2020 |
| WO | 2021/126580 | 6/2021 |

\* cited by examiner

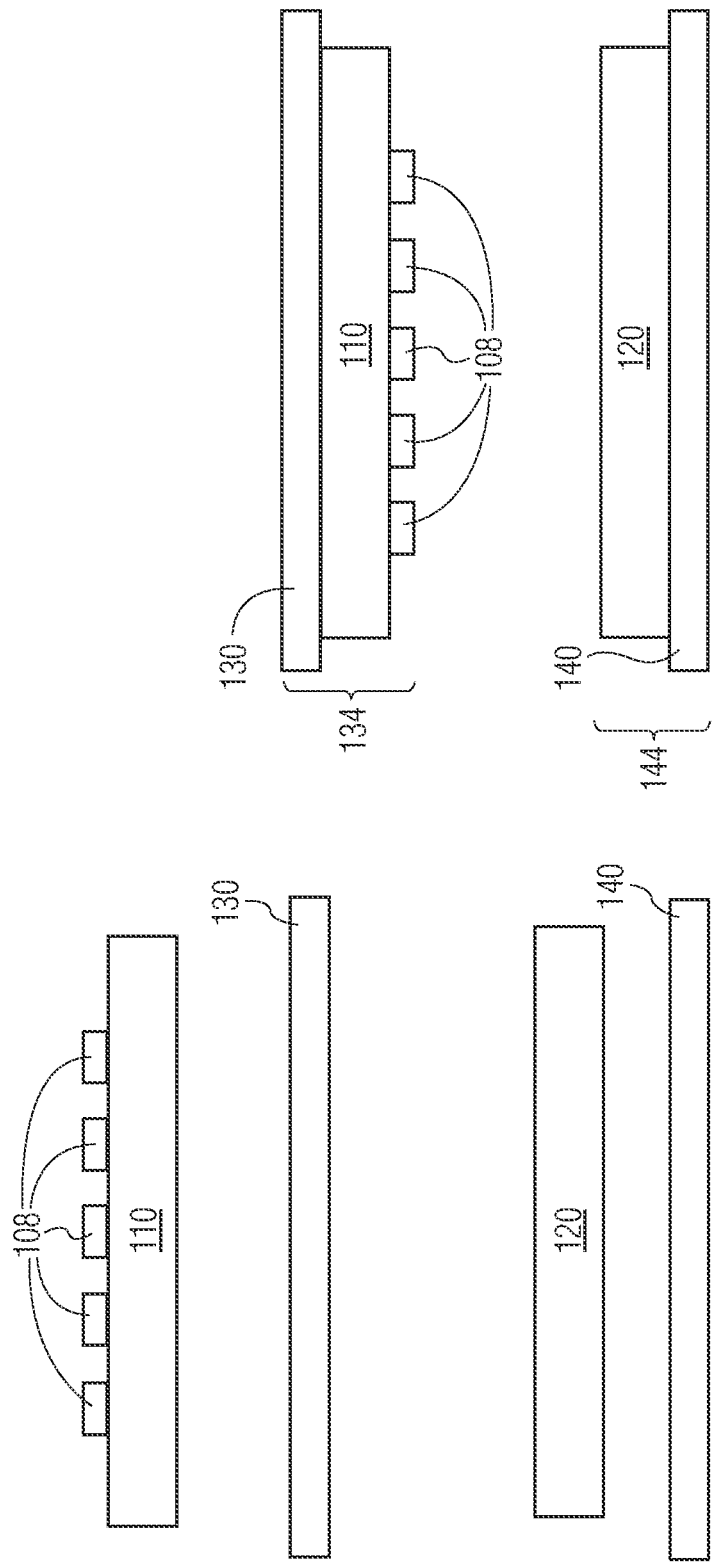

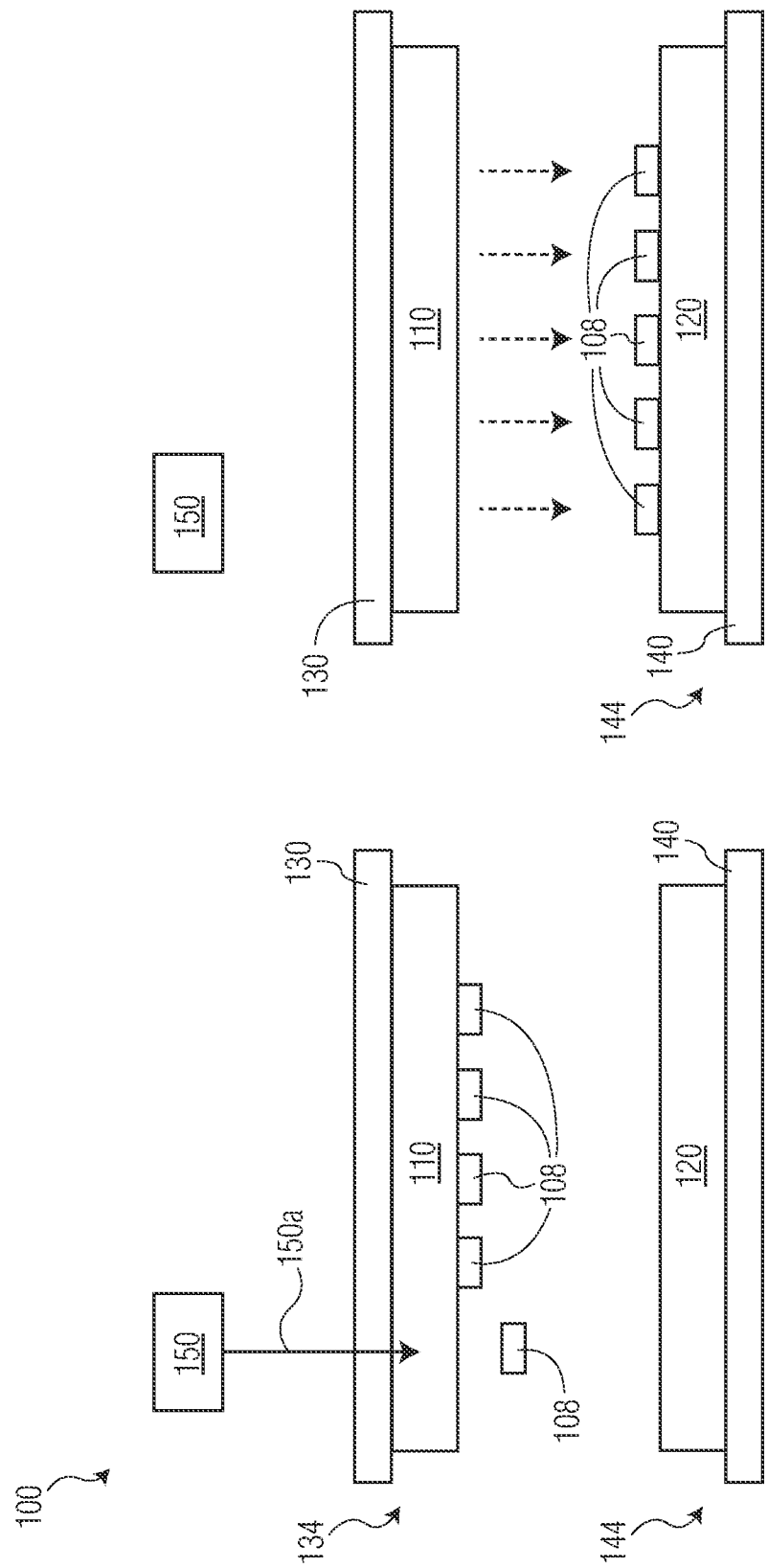

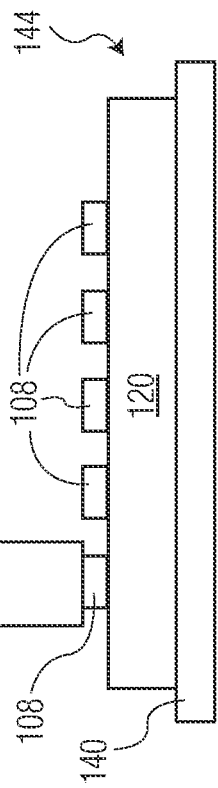
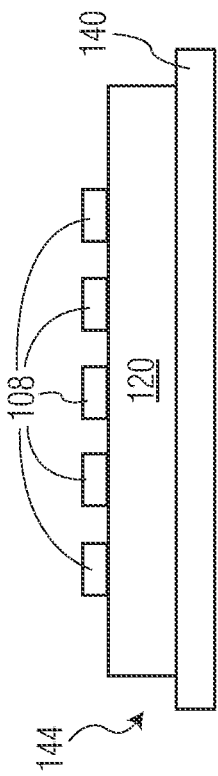

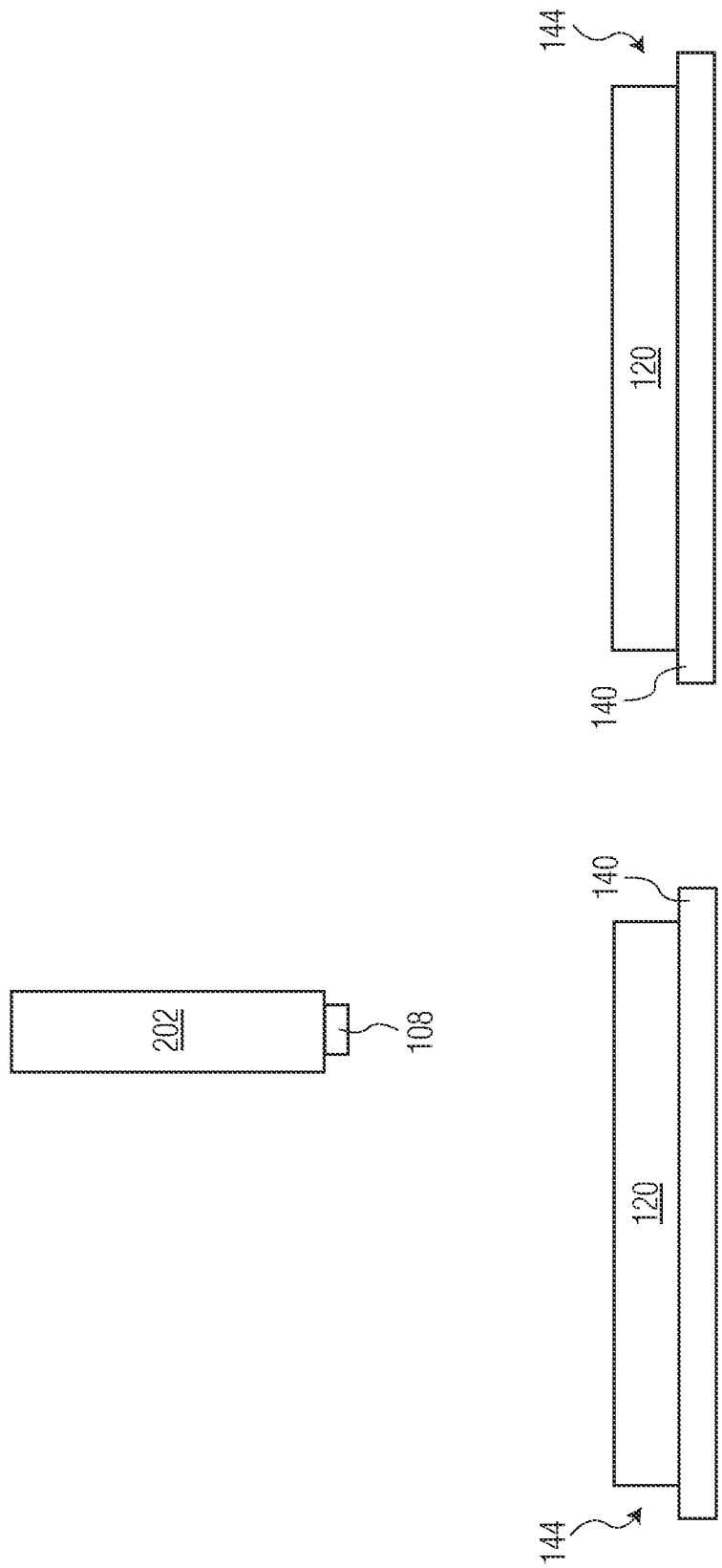

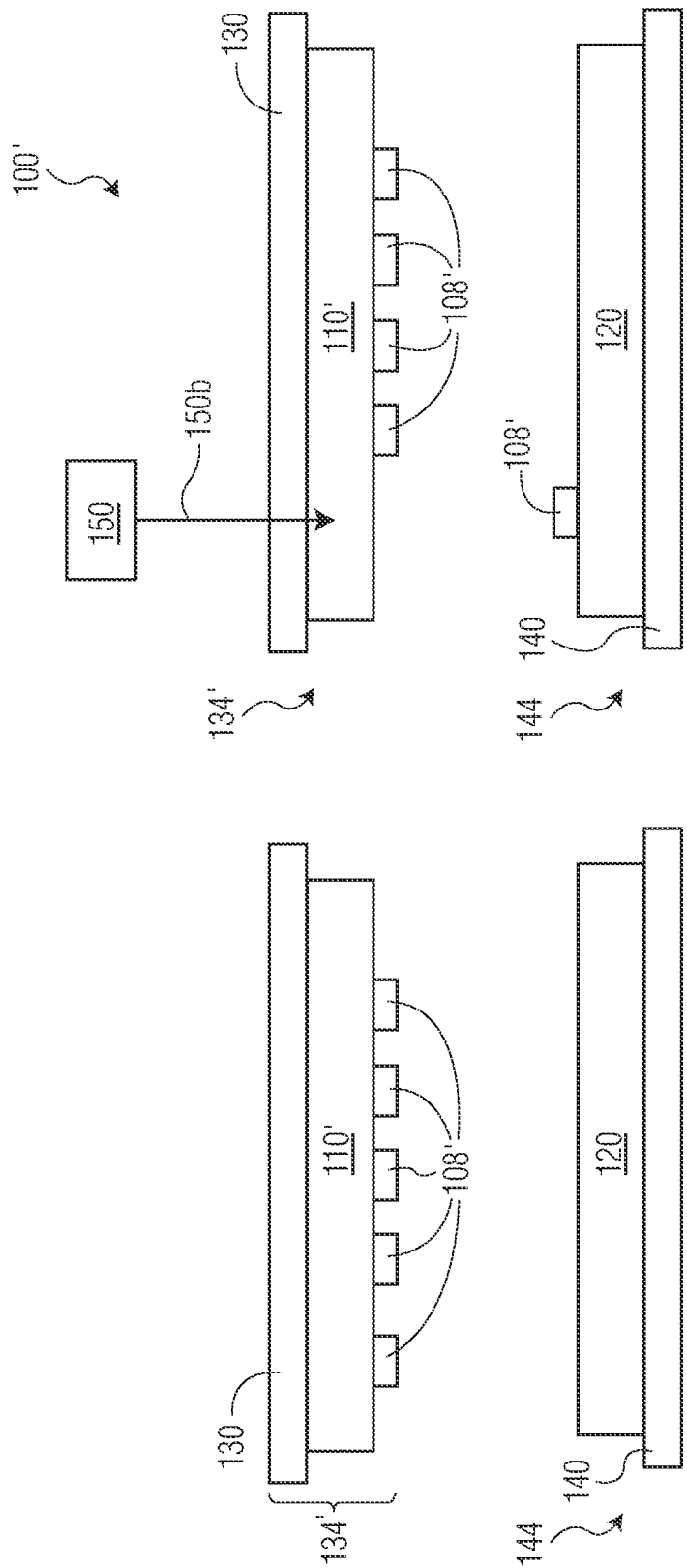

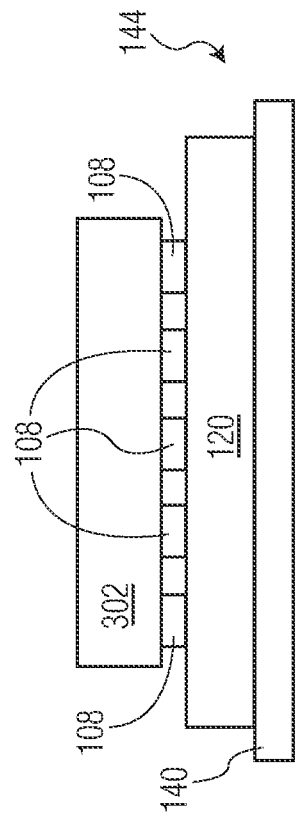
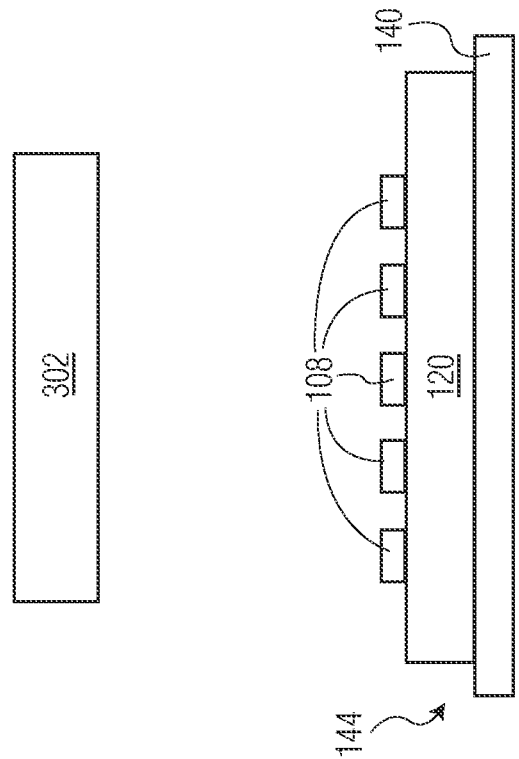
FIG. 3A
FIG. 3B

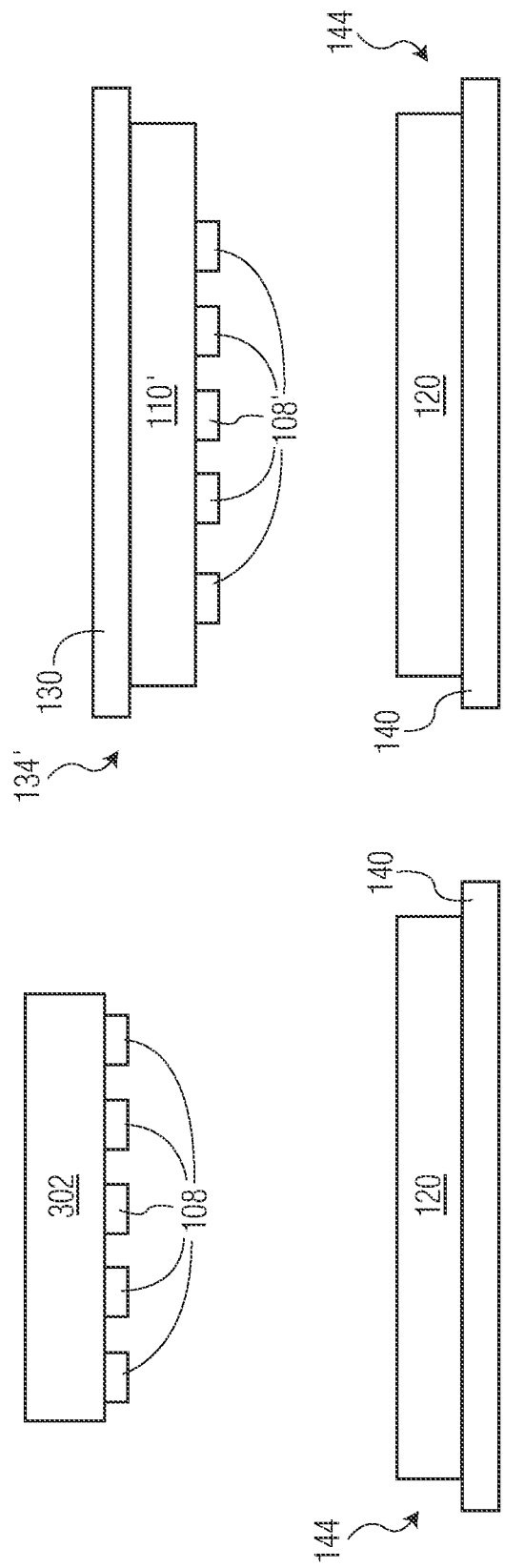

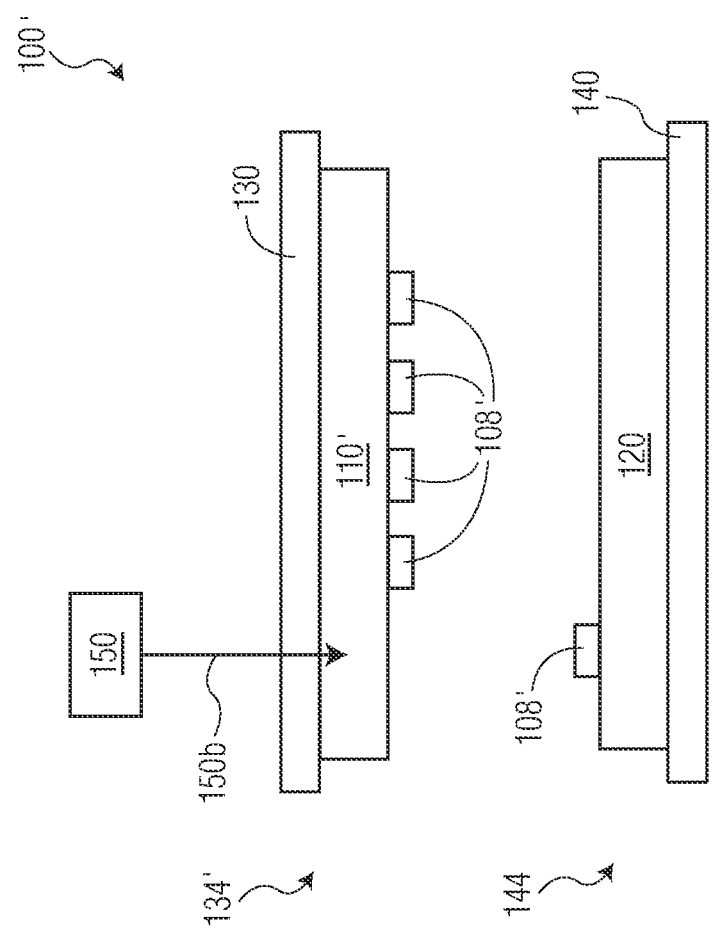

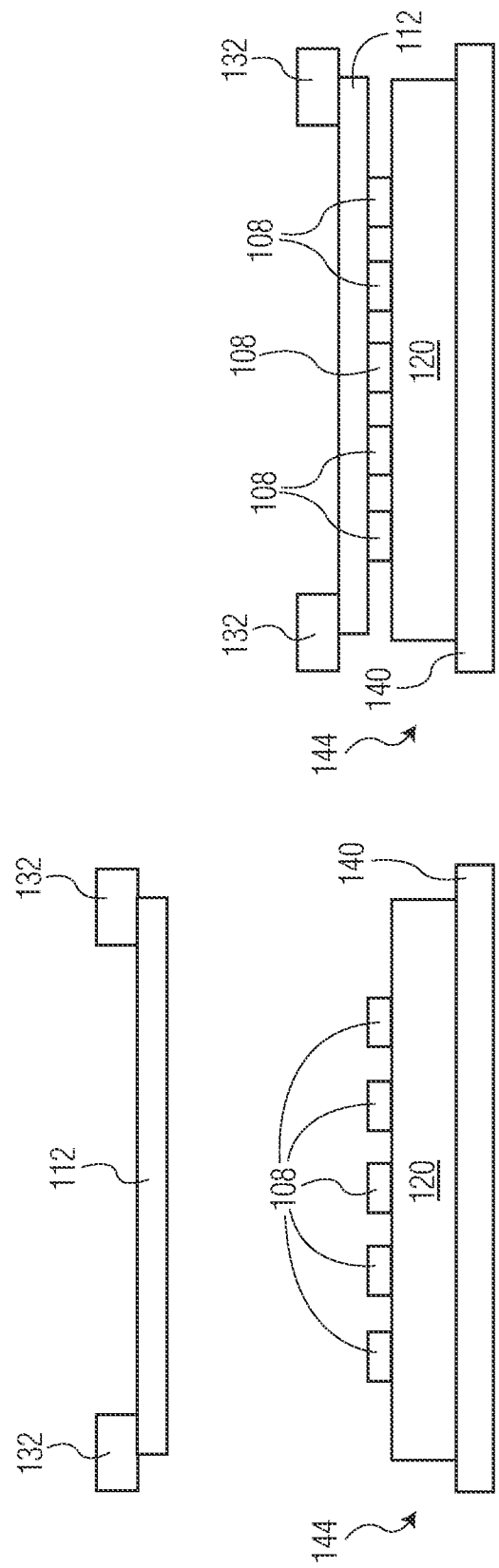

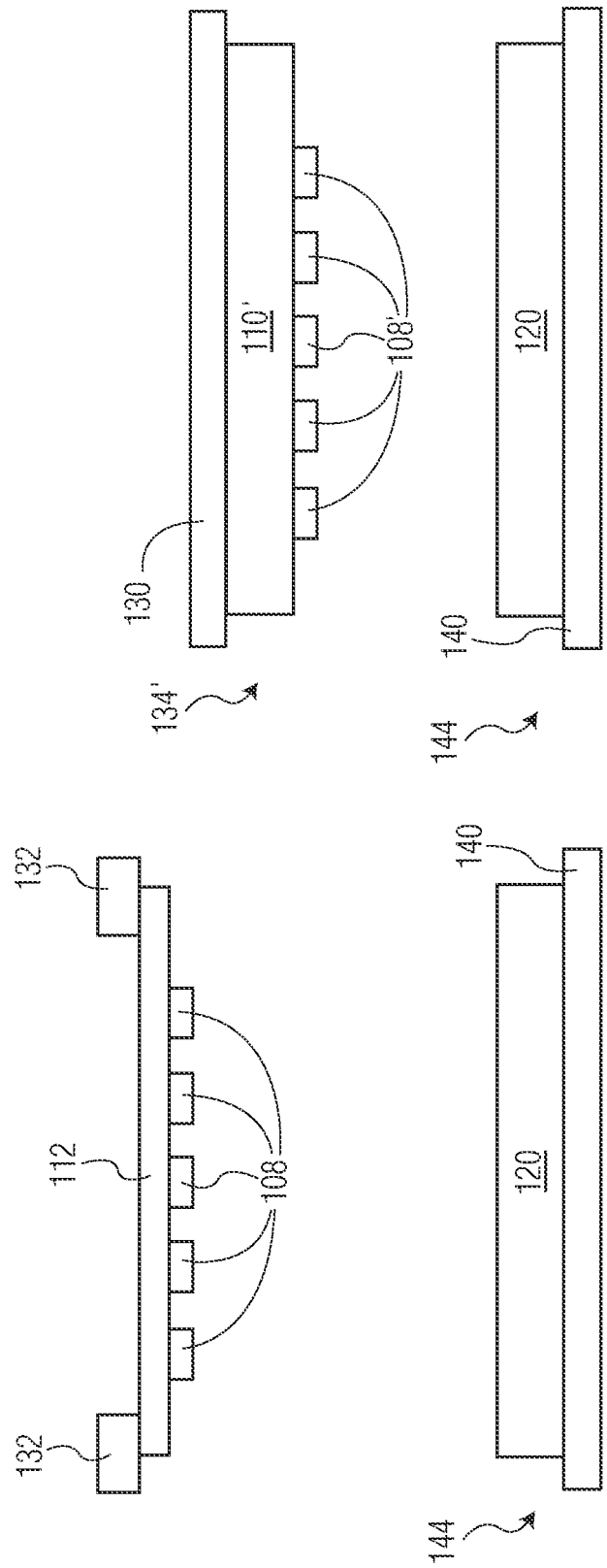

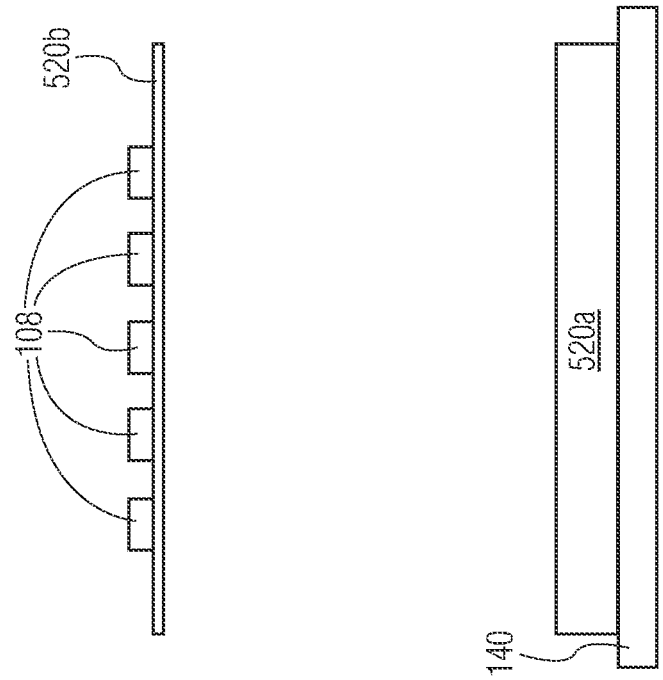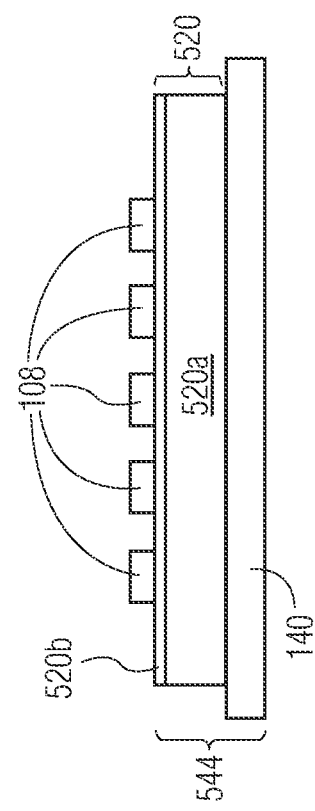
FIG. 5A
FIG. 5B

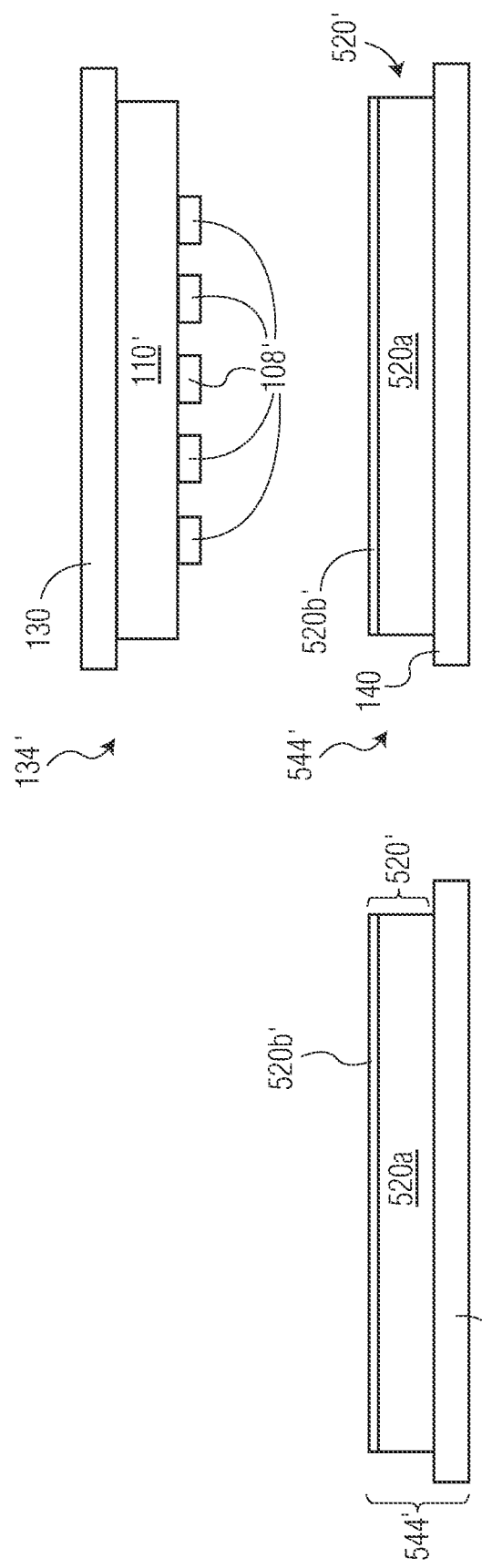

REUSABLE DIE CATCH MATERIALS, REUSABLE DIE RELEASE MATERIALS, RELATED DIE TRANSFER SYSTEMS, AND METHODS OF USING THE SAME

CROSS-REFERENCE TO RELATED APPLICATIONS

This application claims the benefit of U.S. Provisional Application No. 63/081,522, filed Sep. 22, 2020, and U.S. Provisional Application No. 63/081,861, filed Sep. 22, 2020, the content of both of which is incorporated herein by reference.

FIELD

The invention relates to systems and methods for transfer of die, and in particular, to improved systems and methods for transferring die using reusable materials.

BACKGROUND

In the semiconductor assembly and manufacturing industry, die placement and transfer utilizes a number of different technologies. One example type of die are LED (e.g., light emitting diode) die. Such LED die may be used in connection with the assembly and manufacture of various types of displays.

Exemplary technologies related to die transfer (including LED die transfer, and/or laser based transfer) are disclosed in the following patent documents, each of which is incorporated by reference herein: U.S. Pat. No. 9,862,141 (entitled "SELECTIVE LASER-ASSISTED TRANSFER OF DISCRETE COMPONENTS"); U.S. Pat. No. 10,748,802 (entitled "PLACING ULTRA-SMALL OR ULTRA-THIN DISCRETE COMPONENTS"); U.S. Patent Application Publication No. 2020/0168498 (entitled "PARALLEL ASSEMBLY OF DISCRETE COMPONENTS ONTO A SUBSTRATE"); International Publication No. WO 2020/252161 (entitled "MATERIAL FOR POSITIONAL ERROR COMPENSATION IN ASSEMBLY OF DISCRETE COMPONENTS"); International Publication No. WO 2020/252164 (entitled "POSITIONAL ERROR COMPENSATION IN ASSEMBLY OF DISCRETE COMPONENTS BY ADJUSTMENT OF OPTICAL SYSTEM CHARACTERISTICS"); International Publication No. WO 2020/168174 (entitled "DYNAMIC RELEASE TAPES FOR ASSEMBLY OF DISCRETE COMPONENTS"); and International Publication No. WO 2021/126580 (entitled "ADHESIVE TAPES FOR RECEIVING DISCRETE COMPONENTS").

Unfortunately, the transfer and/or placement of certain die (e.g., LED die, mini LED die, micro LED die, etc.), in particular in laser assisted transfer applications, involves a number of complexities (e.g., costs, efficiency, repeatability, etc.). Such complexities often relate to materials (e.g., consumable materials) used in the transfer processes.

Thus, it would be desirable to provide improved systems and methods for transferring die from a die source to a receive substrate, and improved materials used in connection with the same.

SUMMARY

According to an exemplary embodiment of the invention, a system for transfer of a plurality of die from a die source to a receive substrate is provided. The system includes a die source including a plurality of die, the plurality of die being coupled to a carrier. The system also includes a receive substrate to receive the plurality of die from the die source, the receive substrate including a die catch material for receiving the plurality of die from the die source, the die catch material being reusable. The system also includes a laser source for providing energy to interact with a die release material to transfer the plurality of die from the die source to the receive substrate.

According to another exemplary embodiment of the invention, a method of transferring a plurality of die from a die source to a receive substrate is provided. The method includes the steps of: (a) coupling a plurality of die to a carrier by a die release material, thereby assembling a die source; and (b) applying energy to the die release material using a laser to transfer the plurality of die from the die source to a receive substrate. The receive substrate includes a die catch material for receiving the die from the die source, the die catch material being reusable.

According to yet another exemplary embodiment of the invention, a system for transfer of a plurality of die from a die source to a receive substrate is provided. The system includes a die source including a plurality of die, the plurality of die being coupled to a carrier by a die release material. At least a portion of the die release material is reusable. The system also includes a receive substrate to receive the plurality of die from the die source. The system also includes a laser source for providing energy to interact with the die release material to transfer the plurality of die from the die source to the receive substrate.

According to yet another exemplary embodiment of the invention, a method of transferring a plurality of die from a die source to a receive substrate is provided. The method includes the steps of: (a) coupling a plurality of die to a carrier via a die release material, thereby assembling a die source, at least a portion of the die release material being reusable; and (b) applying energy to the die release material using a laser to transfer the plurality of die from the die source to a receive substrate.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 1A-1B are block diagram side views illustrating coupling of a plurality of die to a carrier, and coupling of a die catch material to a receive substrate, in accordance with an exemplary embodiment of the invention;

FIGS. 1C-1D are block diagram side views illustrating transfer of the plurality of die from the carrier of FIG. 1B to the receive substrate, in accordance with an exemplary embodiment of the invention;

FIGS. 2A-2F are a series of block diagram side views illustrating transfer of the plurality of die from the receive substrate of FIG. 1D using a pick tool, and reuse of the receive substrate, in accordance with an exemplary embodiment of the invention;

FIGS. 3A-3E are a series of block diagram side views illustrating transfer of the plurality of die from the receive substrate of FIG. 1D using another pick tool, and reuse of the receive substrate, in accordance with an exemplary embodiment of the invention;

FIGS. 4A-4E are a series of block diagram side views illustrating transfer of the plurality of die from the receive substrate of FIG. 1D using an adhesive substrate, and reuse of the receive substrate, in accordance with an exemplary embodiment of the invention;

FIGS. 5A-5E are a series of block diagram side views illustrating removal of the plurality of die from an energy absorbing portion of the receive substrate by removing an adhesive portion (e.g., a tape, a film, etc.) of the receive substrate, and reuse of the energy absorbing portion of the receive substrate, in accordance with an exemplary embodiment of the invention;

DETAILED DESCRIPTION

Figure 4E:
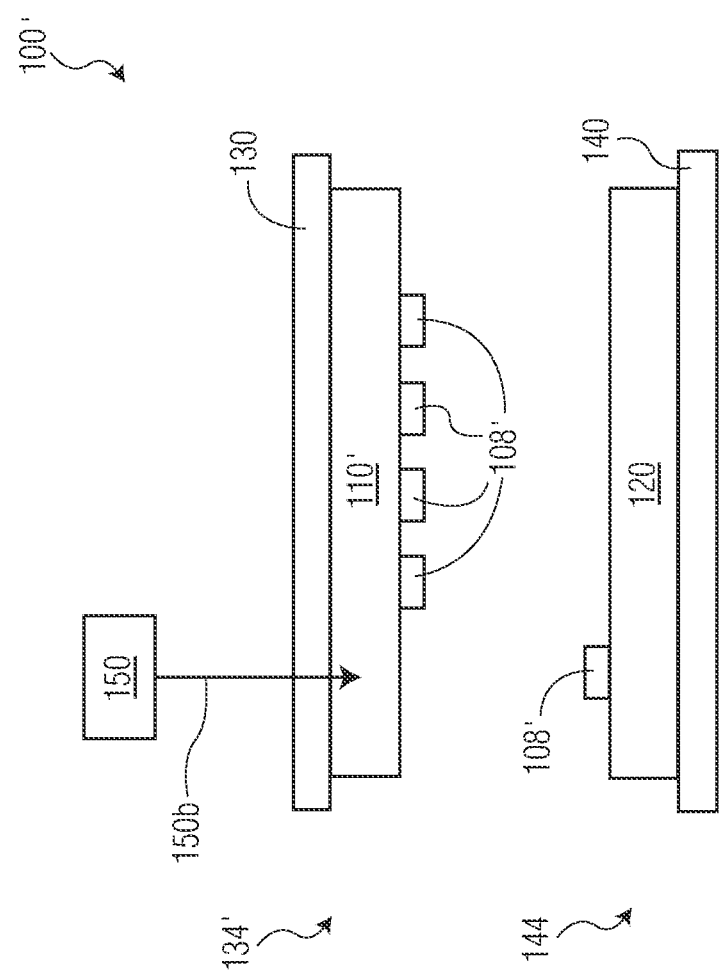

According to certain exemplary embodiments of the invention, in a die transfer process, die are transferred from a die source to a receive substrate (e.g., a target carrier). As used herein, the term "die" shall be broadly defined to include any type of semiconductor element, or any component including such a semiconductor element. Exemplary die include light emitting diodes (i.e., LEDs), mini LEDS, micro LEDs, etc.

In certain example applications, a plurality of die are mounted on a carrier using a die release material. The die release material is activated by energy (e.g., a pulse, a laser beam, etc.) from a laser source in connection with a laser based transfer process. The die is released from the die release material, flies through the air and is caught on the receive substrate by die catch material (sometimes called die catching material) mounted on a base substrate (i.e., target carrier). The die catch material serves to absorb the energy from the flying die, hold the die in the caught position, and (if desired) release the die in subsequent transfer processes. As used herein, a "transfer process" (sometimes referred to as a die transfer process or transfer mechanism) means a process which moves a die from one substrate to another (e.g., from a die source to a receive substrate). A laser based transfer process (e.g., which may also be referred to as a laser assisted transfer process) may include a number of processes, including at least one of an ablative process, a blistering process, a thermal release process, and/or a surface morphology change process. Aspects of this invention relate to a die catch material which is reusable for multiple transfer processes. Other aspects relate to a die release material (e.g., reusable adhesive material) included as part of the die source, where the die release material is at least partially reusable for multiple transfer processes.

As used herein, the term "reusable", in the context of a reusable die catch material or a reusable die release material, is intended to refer to a characteristic in which a material may be used in more than one transfer process (e.g., a laser transfer process). In certain applications, only a portion of the die catch material or the die release material may be reusable. A reusable material lowers material costs, complexities, and other related costs associated with reapplying die catch material or die release material (e.g., a dynamic release layer) for multiple transfers.

Existing transfer processes describe the die catch material as being single use and needing to be reapplied after each use. In accordance with exemplary aspects the invention, the material is specifically designed to be used multiple times, which reduces process complexity and cost.

As used herein, the term "carrier" is intended to refer to any structure which carries a plurality of die (directly or indirectly) in connection with a die transfer process. Exemplary carriers include: a rigid substrate; a glass substrate; a laser transparent substrate; a flexible freestanding carrier; and/or other freestanding structures used to transport substrates and/or die. Freestanding structures (such as carriers and/or freestanding dynamic release tapes) are described in International Publication Number WO 2020/168174 (entitled "DYNAMIC RELEASE TAPES FOR ASSEMBLY OF DISCRETE COMPONENTS"), the content of which is incorporated herein by reference. As used herein, the term "die catch material" is intended to refer to a material which is used to receive a die during a transfer process. A die catch material may include at least one of: a homogenous material; a heterogenous material; a multi-layered material; an adhesive material; an energy absorbing material; and/or a kinetic energy absorbing material.

Throughout the present application die catch materials and die release materials are described. An example structure of a die release material includes: a base layer (e.g., a PET material); a laser absorption layer (e.g. a polyimide material); and a blistering layer and an adhesive layer (where the blistering layer and the adhesive layer could be 2 distinct layers, or could be a single layer of material that serves both functions). An example structure of a die catch material includes: a base layer (e.g., a PET material); an energy absorbing layer (e.g. a Bingham plastic); and an adhesive layer.

Referring now to FIGS. 1A-1D, a series of block diagram side views of systems for transfer of die (and related methods) is illustrated. In FIG. 1A, a plurality of die 108 have been attached to a die release material 110. Die release material 110 may include any structure as desired in the given application. For example, die release material 110 may include at least one of an adhesive layer and a reactive layer (not shown for simplicity). Also shown in FIG. 1A are a die catch material 120, a carrier 130, and a base substrate 140.

In FIG. 1B, the plurality of die 108 have been coupled to carrier 130 using die release material 110, thereby assembling a die source 134. It shall be understood that additional layers or materials may be included in die source 134 in addition to those illustrated. For example, the plurality of die 108 may be carried by a tape (such as a wafer tape, a die bonding tape, etc.) before being secured to die release material 110.

Likewise, die catch material 120 has been coupled to base substrate 140, thereby assembling a receive substrate 144.

As used herein, the terms "coupled" or "coupling" refer to any type of attachment between more than one element, whether the attachment is direct or indirect. For example, two elements may be coupled together via another element. In another example, two elements may be coupled together with an intermediate element (or multiple intermediate elements) provided therebetween.

FIG. 1C illustrates a system 100 for transfer of the plurality of die 108 from die source 134 to receive substrate 144. In addition to die source 134 and receive substrate 144, system 100 includes laser source 150. Laser source 150 provides energy 150a (e.g., a laser beam) through carrier 130 to transfer die 108 from die source 134 to die catch material 120. Although FIG. 1C illustrates the transfer of a single die 108, it is understood that the plurality of die 108 may be transferred one at a time, or with multiple of the plurality of die 108 being transferred simultaneously. The transfer process may include at least one of a number of processes, including an ablative process, a blistering process, a thermal release process, and/or a surface morphology change process (e.g., on a surface of an adhesive layer). As illustrated in FIG. 1D, all of the die 108 have now been transferred from die source 134 to receive substrate 144. As such, the plurality of die 108 (now on receive substrate 144) are prepared for a subsequent transfer operation.

Each of FIGS. 2A-2F, FIGS. 3A-3E, FIGS. 4A-4E, and FIGS. 5A-E illustrate an exemplary subsequent transfer operation transferring the plurality of die 108 away from receive substrate 144. Regardless of the subsequent transfer operation used, after the plurality of die 108 have been transferred from receive substrate 144, in accordance with aspects of the invention, receive substrate 144 (including die catch material 120) is reusable.

Referring now to FIGS. 2A-2F, a transfer of the plurality of die 108 away from receive substrate 144 (e.g., to another substrate), and the subsequent reuse of the die catch material 120, is illustrated. In FIG. 2A, receive substrate 144 (from FIG. 1D) is illustrated with a plurality of die 108. A pick tool 202 (e.g., a pick-and-place tool, or another component transfer tool) is illustrated above receive substrate 144 prior to a transfer operation. In FIG. 2B, pick tool 202 has been moved toward receive substrate 144 until pick tool 202 makes contact with a die 108—so that pick tool 202 can move the die 108 away from receive substrate 144. In FIG. 2C, pick tool 202 is illustrated transferring (i.e., "picking") a last die 108 from receive substrate 144. In FIG. 2D, receive substrate 144 is illustrated without the plurality of die 108 (i.e., all of the plurality of die 108 having been removed by pick tool 202), in preparation for another transfer. In FIG. 2E, another die source 134' is positioned above receive substrate 144, in preparation for another die transfer process. Die source 134' includes a plurality of die 108' coupled to carrier 130 using die release material 110'.

FIG. 2F illustrates a system 100' for transfer of the plurality of die 108' from die source 134' to receive substrate 144. In addition to die source 134' and receive substrate 144, system 100' includes laser source 150. Laser source 150 provides energy 150b (e.g., a laser beam) through carrier 130 to transfer die 108' from die source 134' to receive substrate 144. FIG. 2F illustrates the leftmost die 108' having been transferred from die source 134' to receive substrate 144 (specifically the top surface of die catch material 120). Thus, die catch material 120 of receive substrate 144 has been reused in this transfer process.

Referring now to FIGS. 3A-3E, a transfer of the plurality of die 108 away from receive substrate 144 (e.g., to another substrate), and the subsequent reuse of the die catch material 120, is illustrated. In FIG. 3A, receive substrate 144 (from FIG. 1D) is illustrated with a plurality of die 108. Another pick tool 302 (e.g., a pick-and-place tool for multi-die transfer, a PDMS stamp, etc.) is illustrated above receive substrate 144 prior to a transfer operation. In FIG. 3B, pick tool 302 has been moved toward receive substrate 144 until pick tool 302 makes contact with a plurality of die 108—so that pick tool 302 can move the plurality of die 108 away from receive substrate 144. In FIG. 3C, pick tool 302 is illustrated transferring (i.e., "picking") the plurality of die 108 from receive substrate 144. In FIG. 3D, receive substrate 144 is illustrated without the plurality of die 108 (i.e., the plurality of die 108 having been removed by pick tool 302), in preparation for another transfer. Another die source 134' is positioned above receive substrate 144, in preparation for another die transfer process. Die source 134' includes a plurality of die 108' coupled to carrier 130 using die release material 110'.

FIG. 3E illustrates system 100' for transfer of the plurality of die 108' from die source 134' to receive substrate 144. FIG. 3E illustrates the leftmost die 108' having been transferred from die source 134' to receive substrate 144 (specifically the top surface of die catch material 120). Thus, die catch material 120 of receive substrate 144 has been reused in this transfer process.

Referring now to FIGS. 4A-4E, a transfer of the plurality of die 108 away from receive substrate 144 (e.g., to another substrate), and the subsequent reuse of the die catch material 120, is illustrated. In FIG. 4A, receive substrate 144 (from FIG. 1D) is illustrated with a plurality of die 108. A wafer ring 132 is illustrated positioned above receive substrate 144. An adhesive substrate 112 (e.g., dicing tape) is attached to wafer ring 132. In FIG. 4B, wafer ring 132 has been moved toward receive substrate 144 until adhesive substrate 112 makes contact with the plurality of die 108. In FIG. 4C, wafer ring 132 and adhesive substrate 112 have been moved away from receive substrate 144. Adhesive substrate 112, having a stronger adhesive property than die catch material 120, has lifted the plurality of die 108 after the wafer ring 132 was moved away from receive substrate 144. Receive substrate 144 is illustrated without the plurality of die 108 (i.e., the plurality of die 108 having been removed by adhesive substrate 112), in preparation for another transfer. In FIG. 4D, another die source 134' is positioned above receive substrate 144, in preparation for another die transfer process.

FIG. 4E illustrates system 100' for transfer of the plurality of die 108' from die source 134' to receive substrate 144. The leftmost die 108' is illustrated having been transferred from die source 134' to receive substrate 144 (specifically the top surface of die catch material 120). Thus, die catch material 120 of receive substrate 144 has been reused in this transfer process.

It will be appreciated by those skilled in the art that a different type of transfer structure (including an adhesive) could be utilized instead of a wafer ring in FIGS. 4A-4C. That is, wafer ring 132 is simply an example of such a transfer structure including an adhesive (i.e., adhesive substrate 112). In any case, the transfer structure should include (or use) an adhesive property that can remove the plurality of die from receive substrate 144.

Figure 5E:
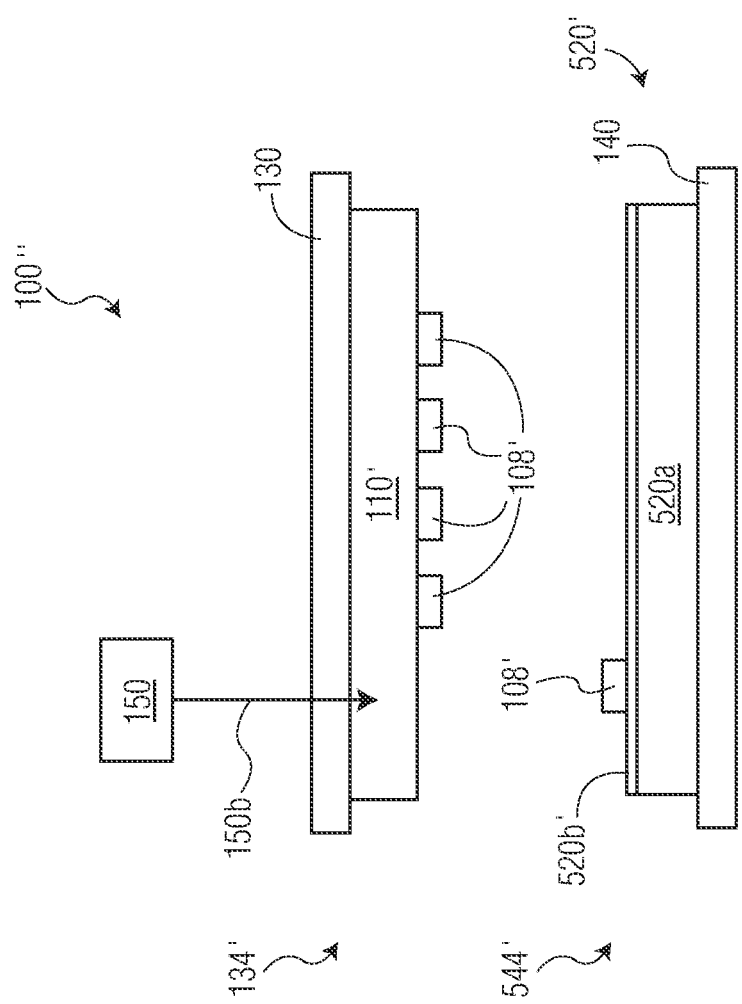

Referring now to FIGS. 5A-5E, a transfer of the plurality of die 108 away from receive substrate 544 (e.g., to another substrate), and the subsequent reuse of an energy absorbing portion 520a of a die catch material 520, is illustrated. In FIG. 5A, receive substrate 544 (e.g., similar to receive substrate 144 from FIG. 1D) is illustrated with the plurality of die 108. Receive substrate 544 includes die catch material 520 on a base substrate 140, where die catch material 520 includes energy absorbing portion 520a and an adhesive portion 520b (e.g., a tape, a film, an adhesive layer, etc.). In FIG. 5B, adhesive portion 520b is removed from energy absorbing portion 520a, thereby removing the plurality of die 108 from receive substrate 544. Adhesive portion 520b may be removed using any of a number of techniques such as manual removal (e.g., peeling), automatic removal, etc. In FIG. 5C, another adhesive portion 520b' has been coupled to energy absorbing portion 520a, thereby assembling receive substrate 544'. In FIG. 5D, another die source 134' is positioned above receive substrate 544', in preparation of another die transfer process.

FIG. 5E illustrates a system 100" (which is substantially similar to previously described system 100') for transfer of the plurality of die 108' from die source 134' to receive substrate 544'. The leftmost die 108' has been transferred from die source 134' to receive substrate 544' (specifically the top surface of adhesive portion 520b'). Thus, energy absorbing portion 520a has been reused in this transfer process.

FIGS. 1A-1D, FIGS. 2A-2F, FIGS. 3A-3E, FIGS. 4A-4E, and FIGS. 5A-5E illustrate various exemplary aspects of the invention related to applications involving a reusable die match material. However, additional aspects of the invention relate to a reusable (or at least partially reusable) die release material. FIGS. 6A-6J and FIGS. 7A-7B relate to applications involving such a reusable die release material.

Figure 6A:
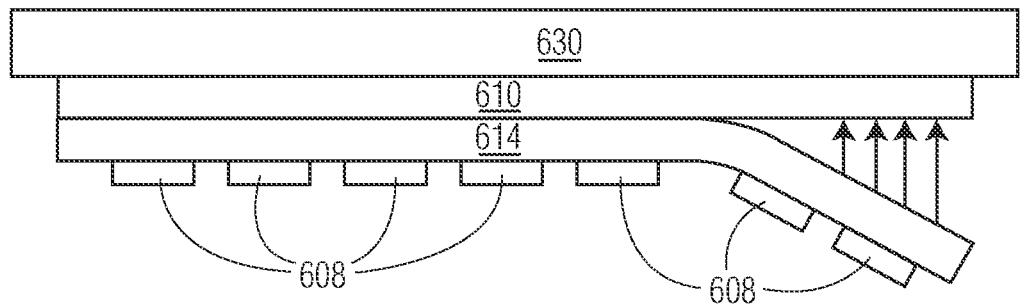
FIGS. 6A-6B are a series of block diagram side views illustrating assembly of a die source including a die release material in accordance with an exemplary embodiment of the invention.
Figure 6B:
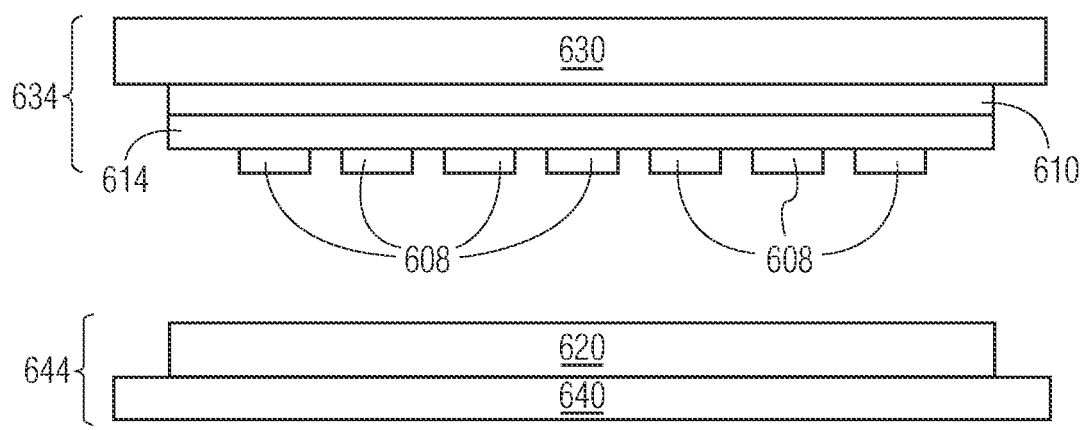
Figure 6C:
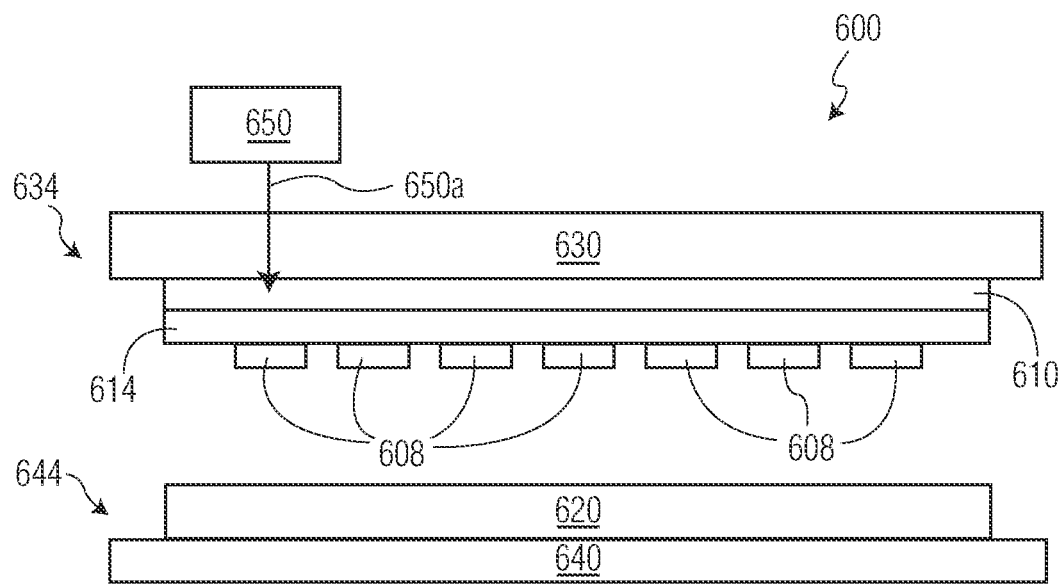
FIGS. 6C-6E are a series of block diagram side views illustrating transfer of a plurality of die from the die source of FIG. 6B to a receive substrate, in accordance with an exemplary embodiment of the invention.
Figure 6D:
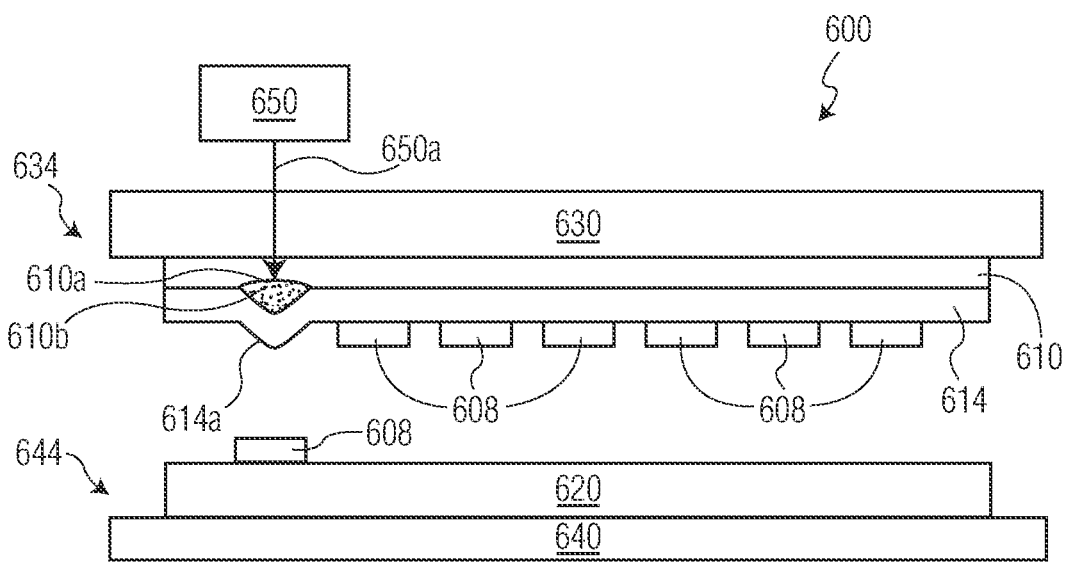

Referring specifically to FIG. 6A, a tape 614 (e.g., a wafer tape, a die bonding tape, etc.) carrying a plurality of die 608 is illustrated in the process of being coupled to a die release material 610 on a carrier 630, thereby assembling a die source 634 (see FIG. 6B). More specifically, die source 634 includes the plurality of die 608 indirectly coupled to carrier 630 using die release material 610 and tape 614. As shown in FIG. 6B, a receive substrate 644 (including a die catch material 620 and a base substrate 640) is positioned beneath die source 634, in preparation for a transfer process. FIG. 6C illustrates a system 600 for transfer of a plurality of die 608 from die source 634 to receive substrate 644. System 600 includes die source 634, receive substrate 644, and a laser source 650. Laser source 650 provides energy 650a (e.g., a laser beam) to interact with die release material 610 to transfer the plurality of die 608 from die source 634 to receive substrate 644. In FIG. 6D, one of the plurality of die 608 has been transferred from die source 634 (more specifically from tape 614) to receive substrate 644 (more specifically to the surface of die catch material 620 facing die source 634). FIG. 6D illustrates a transfer process including "blistering". However, is is understood that the transfer processes may include one or more of the following aspects: a blistering process; an ablative process; a thermal release process; and a surface morphology change process (e.g., changing a surface of the die release material 610 adjacent the respective die 608).

Regarding the blistering process shown in FIG. 6D, energy 650a (provided by laser source 650) is transmitted through carrier 630 to an area 610a of die release material 610. The interaction of energy 650a and die release material 610 (which may include a reactive layer or material for interacting with energy 650a) results in a gas 610b being generated. Pressure from the generation of gas 610b results in the formation of a blister 614a. As will be understood by those skilled in the art, area 610a may be partially ablated (as illustrated in FIG. 6D) in connection with the transfer process. Die 608 is thereafter transferred by blister 614a to receive substrate 634, as illustrated. Details of exemplary blistering transfer processes are described in U.S. Pat. No. 9,862,141 (entitled "SELECTIVE LASER-ASSISTED TRANSFER OF DISCRETE COMPONENTS").

Figure 6E:
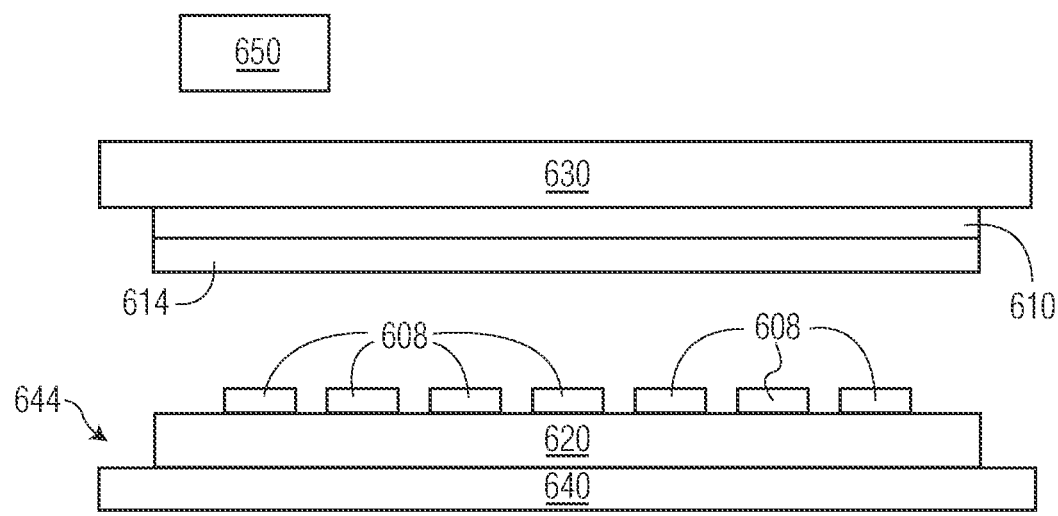
Figure 6F:
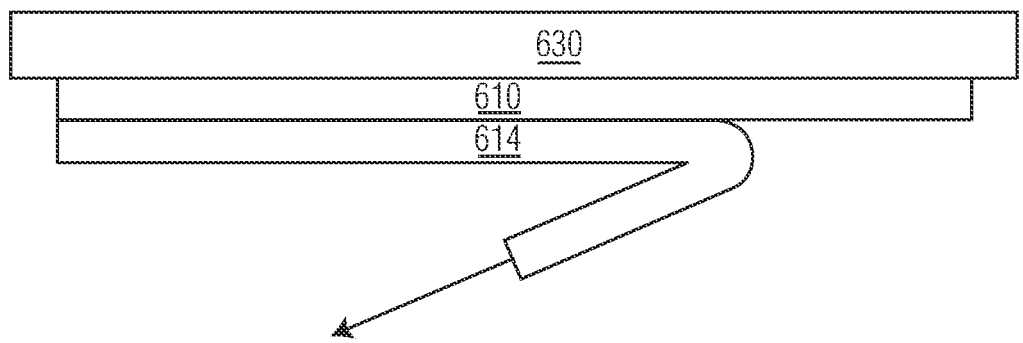
FIG. 6F is a block diagram side view illustrating separation of (i) a tape of the die source (the tape previously carrying the plurality of die) from (ii) the die release material of the die source, in accordance with an exemplary embodiment of the invention.
Figure 6G:
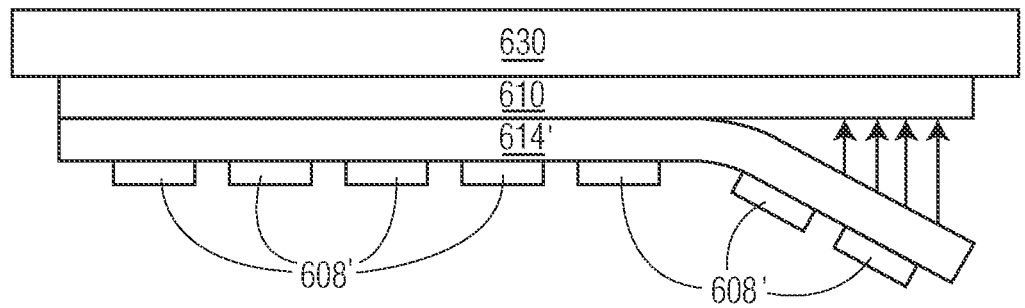
FIGS. 6G-6H are a series of block diagram side views illustrating assembly of another die source including the die release material of FIGS. 6A-6F, in accordance with an exemplary embodiment of the invention.
Figure 6H:
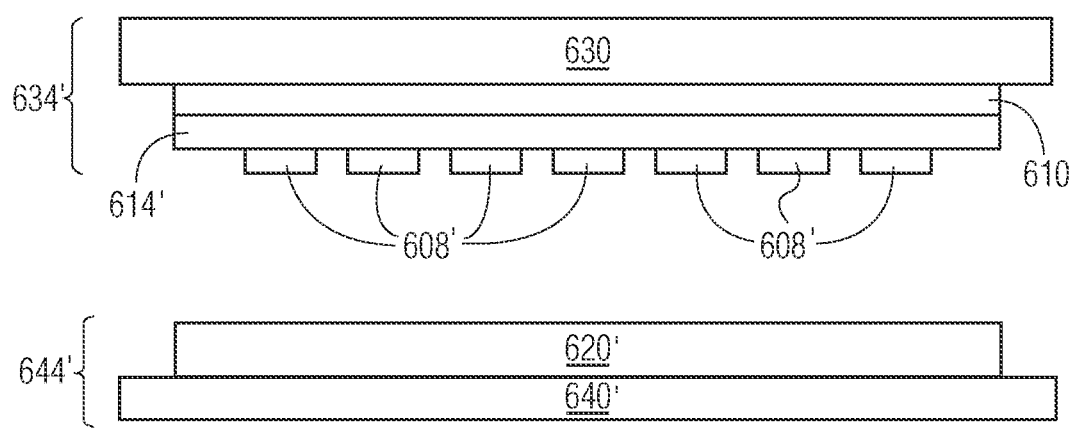
Figure 6I:
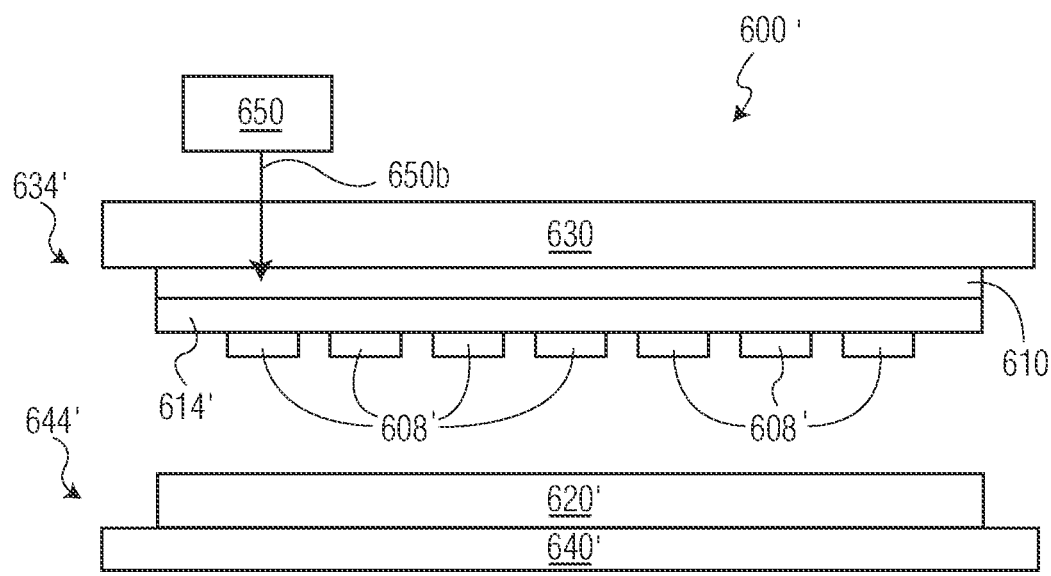
FIGS. 6I-6J are a series of block diagram side views illustrating transfer of a plurality of die from the die source of FIG. 6H to a receive substrate, in accordance with an exemplary embodiment of the invention.
Figure 6J:
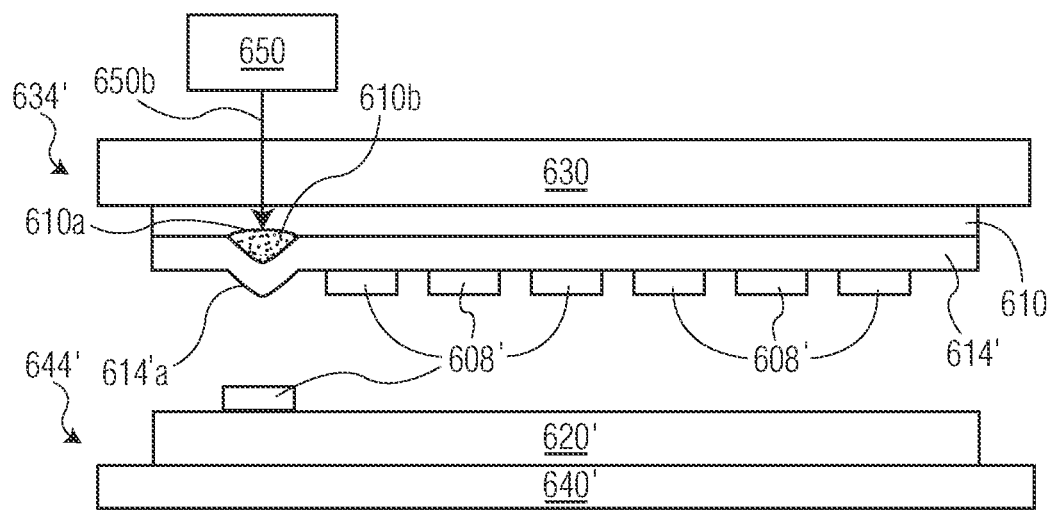

In FIG. 6E, all of the plurality of die 608 have been transferred. In FIG. 6F, tape 614 is illustrated being removed (i.e., decoupled) from die release material 610. Tape 614 is subsequently discarded. In FIG. 6G, another tape 614' (e.g., a wafer tape, carrying a plurality of die 608') is coupled to die release material 610, thereby indirectly coupling the plurality of die 608' to carrier 630. In FIG. 6H, die release material 610 is reused in creating another die source 634' (including the plurality of die 608' and carrier 630). Die source 634' is positioned above receive substrate 644' (including another die catch material 620' and another base substrate 640') in preparation for another transfer process. In FIG. 6I, a system 600' for transfer of the plurality of die 608' from die source 634' to receive substrate 644' is illustrated. System 600' includes die source 634', receive substrate 644', and laser source 650. Die release material 610 is being reused in another transfer process. Laser source 650 is illustrated transmitting energy 650b in connection with a transfer process. In FIG. 6J, another blistering process is illustrated, although a number of transfer processes may be used (including an ablative process, a thermal release process, and a surface morphology change process for the surface). After energy 650b is transmitted through carrier 630 to a portion 610a of die release material 610 (including, for example, a reactive layer/portion), gas 610b is generated, consequently building pressure on surface 610a to form a blister 614'a. Another die 608' (specifically the leftmost die 608') has been transferred by blister 614'a to receive substrate 644'.

Figure 7A:
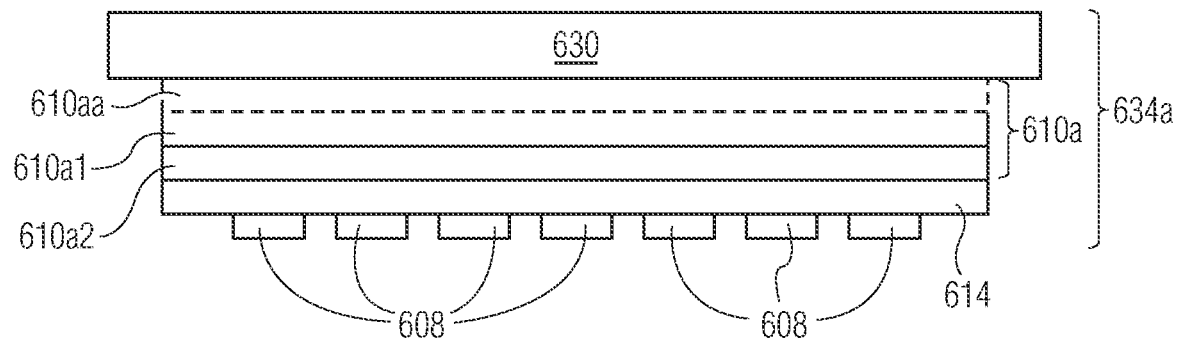
FIGS. 7A-7B are side views of block diagrams illustrating die sources with example die release materials in accordance with various exemplary embodiments of the invention.
Figure 7B:
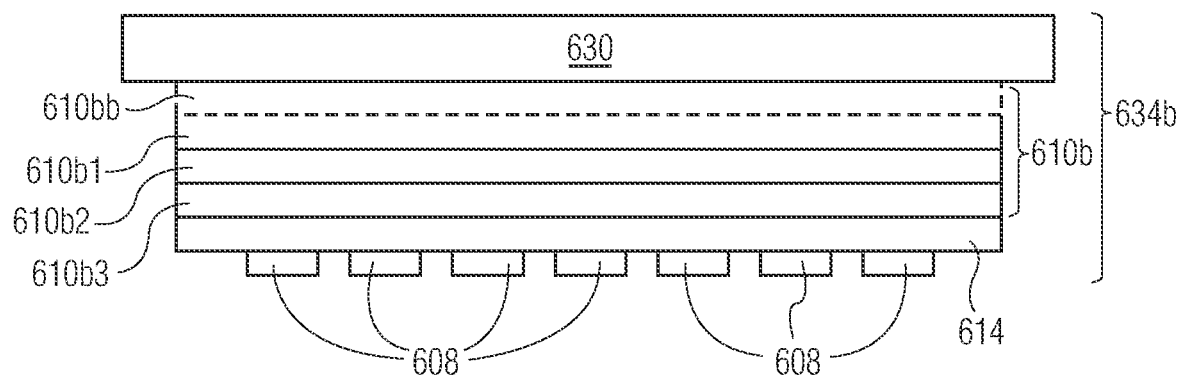

As will be appreciated by those skilled in the art, a structure of a die release material used in connection with the present invention may vary depending on the specific application and requirements. Thus, there is not a single structure for die release material 610 shown in FIGS. 6A-6J. FIGS. 7A-7B illustrate exemplary die release materials 610a and 610b, which could be used as die release material 610 in FIGS. 6A-6J (and further could be used as die release materials 110, 110' in the prior drawings). Of course, other structures of die release material 610 (or die release materials 110, 110') are contemplated.

Referring specifically to FIG. 7A, the plurality of die 608 are illustrated indirectly coupled to carrier 630 through a die release material 610a (and tape 614), thereby assembling die source 634a. Die release material 610a includes a base layer 610a1 and a reactive layer 610a2 (e.g., an ablation layer, a blistering layer, a gas forming layer, etc.). Tape 614 may also be used as a blistering layer. Die release material 610a optionally includes an adhesive layer 610aa for adhering die release material 610a to carrier 630; however, such an adhesive may be provided directly on carrier 630 (and not as part of die release material 610a).

In FIG. 7B, the plurality of die 608 are illustrated coupled to tape 614. Tape 614 is coupled to carrier 630 through a die release material 610b, thereby forming die source 634b. Die release material 610b includes a base layer 610b1, a reactive layer 610b2 (e.g., an ablation layer, a blistering layer, a gas forming layer, etc.), and an adhesive layer 610b3. Die release material 610b optionally includes an adhesive layer 610bb for adhering die release material 610a to carrier 630;

however, such an adhesive may be provided directly on carrier 630 (and not as part of die release material 610*b*).

Although the embodiments of the invention discussed thus far relate principally to transfer processes using either of a reusable die catch material or a reusable die release material, the invention is not so limited. For example a process involving the use of both a reusable die catch material and a usable die release material is contemplated. Thus, the die catch material of any of FIGS. 2A-2F, FIGS. 3A-3E, FIGS. 4A-4E, and/or FIGS. 5A-5E (or any other reusable die catch material within the scope of the invention) may be combined with the die release material of FIGS. 6A-6J and/or FIG. 7A-7B (or any other reusable die release material within the scope of the invention) in connection with a system (or method) for transferring a plurality of die from a die source to a receive substrate.

Four additional exemplary embodiments of the invention are recited below.

In a first additional embodiment, a system for transfer of die from a source to a receive substrate is provided. The system includes a die source including a plurality of die attached to a flexible film. The system also includes a carrier including a reactive layer and an adhesive layer. The die source is coupled to the adhesive layer such that the flexible film is in contact with the adhesive layer. The system also includes a receive substrate to receive the die from the die source, and a laser source for providing energy to interact with the reactive layer to transfer the plurality of die from the die source to the receive substrate. In such a first additional embodiment, a number of additional exemplary aspects include, for example: the flexible film is a wafer tape or a die bonding tape; the reactive layer and the adhesive layer are both included in a tape included as part of the carrier; the transfer of the plurality of die from the die source to the receive substrate is configured to occur one die at a time; the transfer of the plurality of die from the die source to the receive substrate is configured to occur multiple die at a time; a transfer mechanism (i.e., transfer process) for transferring the plurality of die from the die source to the receive substrate includes at least one of an ablative process, a blistering process, a thermal release process, and a surface morphology change process for the surface of the adhesive layer; the plurality of die are LED die; the carrier includes a laser transmissive substrate for supporting the reactive layer and the adhesive layer; and the carrier is a flexible freestanding carrier including the reactive layer and the adhesive layer.

In a second additional embodiment, a method of transferring a plurality of die from a die source to a receive substrate is provided. The method includes the steps of: (a) coupling (i) a die source including a plurality of die attached to a flexible film to (ii) an adhesive layer of a carrier, the carrier also including a reactive layer; and (b) applying energy to the reactive layer using a laser to transfer the plurality of die from the die source to the receive substrate. In such a second additional embodiment of the invention, a number of additional exemplary aspects include, for example: the flexible film is a wafer tape or a die bonding tape; the reactive layer and the adhesive layer are both included in a tape included as part of the carrier; the transfer of the plurality of die from the die source to the receive substrate is configured to occur one die at a time; the transfer of the plurality of die from the die source to the receive substrate is configured to occur multiple die at a time; a transfer mechanism (i.e., transfer process) for transferring the plurality of die from the die source to the receive substrate includes at least one of an ablative process, a blistering process, a thermal release process, and a surface morphology change process for the surface of the adhesive layer; the plurality of die are LED die; the carrier includes a laser transmissive substrate for supporting the reactive layer and the adhesive layer; and/or the carrier is a flexible freestanding carrier including the reactive layer and the adhesive layer.

In a third additional embodiment, another system for transfer of die from a source to a receive substrate is provided. The system includes a plurality of die coupled to a carrier, the carrier including a reactive layer and an adhesive layer. The system also includes a receive substrate to receive the die from the die source, the receive substrate including a first adhesive layer adhered to a receive carrier, and a second adhesive layer adhered to the first adhesive layer. The system also includes a laser source for providing energy to interact with the reactive layer to transfer the plurality of die from the die source to the receive substrate. In such a third additional embodiment, a number of additional exemplary aspects include, for example: the plurality of die are secured to a flexible film, and the flexible film is coupled to the adhesive layer of the carrier; the plurality of die are secured to the adhesive layer of the carrier; the transfer of the plurality of die from the die source to the receive substrate is configured to occur one die at a time; wherein transfer of the plurality of die from the die source to the receive substrate is configured to occur multiple die at a time; a transfer mechanism (i.e., transfer process) for transferring the plurality of die from the die source to the receive substrate includes at least one of an ablative process, a blistering process, a thermal release process, and a surface morphology change process for the surface of the adhesive layer; the plurality of die are LED die; wherein the carrier includes a laser transmissive substrate for supporting the reactive layer and the adhesive layer; the carrier is a flexible freestanding carrier including the reactive layer and the adhesive layer; the second adhesive layer is configured to be removed from the receive substrate, along with ones of the plurality of die transferred to the receive substrate, for subsequent processing. wherein at least one of the first adhesive layer and the second adhesive layer is a tape based adhesive layer; the first adhesive layer is a material design to absorb the energy of the die landing on the second adhesive layer; the first adhesive layer is a gel based adhesive layer, and the second adhesive layer is a tape based adhesive layer (wherein the gel based adhesive layer is a Bingham fluid or plastic fluid; and/or wherein the tape based adhesive layer is a wafer tape or a die bonding tape).

In a fourth additional embodiment, a method of transferring a plurality of die from a die source to a receive substrate is provided. The method includes the steps of: (a) coupling a plurality of die to an adhesive layer of a carrier, the carrier also including a reactive layer; and (b) applying energy to the reactive layer using a laser to transfer the plurality of die from the die source to the receive substrate, the receive substrate including a first adhesive layer adhered to a receive carrier, and a second adhesive layer adhered to the first adhesive layer. In such a fourth additional embodiment of the invention, a number of additional exemplary aspects include, for example: the plurality of die are LED die; the transfer of the plurality of die from the die source to the receive substrate is configured to occur one die at a time; transfer of the plurality of die from the die source to the receive substrate is configured to occur multiple die at a time; a transfer mechanism (i.e., transfer process) for transferring the plurality of die from the die source to the receive substrate includes at least one of an ablative process, a blistering process, a thermal release process, and a surface morphology change process for the surface of the adhesive layer; the plurality of die are secured to a flexible film, and the flexible film is coupled to the adhesive layer of the carrier. wherein the flexible film is a wafer tape; the plurality of die are secured to the adhesive layer of the carrier; the at least one of the first adhesive layer and the second adhesive layer is a tape based adhesive layer; the first adhesive layer is a material design to absorb the energy of the die landing on the second adhesive layer; the first adhesive layer is a gel based adhesive layer, and the second adhesive layer is a tape based adhesive layer; the gel based adhesive layer is a Bingham fluid or plastic fluid; and/or the tape based adhesive layer is a wafer tape or a die bonding tape.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A system for transfer of a plurality of die from a die source to a receive substrate, the system comprising:
    a die source including a plurality of die, the plurality of die being carried by a tape, the tape being coupled to a die release material on a carrier, at least a portion of the die release material being reusable;
    a receive substrate to receive the plurality of die from the die source; and
    a laser source for providing energy to interact with the die release material to transfer the plurality of die from the die source to the receive substrate.

2. The system of claim 1 wherein the tape is a wafer tape.

3. The system of claim 1 wherein the plurality of die are LEDs.

4. The system of claim 1 wherein the transfer of the plurality of die from the die source to the receive substrate is configured to occur multiple die at a time.

5. The system of claim 1 wherein a transfer process for transferring the plurality of die from the die source to the receive substrate includes at least one of an ablative process, a blistering process, a thermal release process, and a surface morphology change process for a surface of the die release material.

6. The system of claim 1 wherein the carrier includes a laser transmissive substrate for supporting the die release material.

7. The system of claim 1 wherein the carrier is a flexible freestanding carrier.

8. The system of claim 1 wherein the plurality of die are mini LEDs.

9. The system of claim 1 wherein the plurality of die are micro LEDs.

10. A method of transferring a plurality of die from a die source to a receive substrate, the method comprising the steps of:
    (a) coupling a plurality of die to a carrier via a die release material on the carrier, thereby assembling a die source the plurality of die being carried by a rape, wherein the tape is coupled to the die release material such that the plurality of die are coupled to the carrier, at least a portion of the die release material being reusable; and
    (b) applying energy to the die release material using a laser to transfer the plurality of die from the die source to a receive substrate.

11. The method of claim 10 further comprising the step of (c) securing another die source including another plurality of die to the carrier using the die release material.

12. The method of claim 10 wherein the tape is a wafer tape.

13. The method of claim 10 wherein the plurality of die are LEDs.

14. The method of claim 10 wherein the transfer of the plurality of die from the die source to the receive substrate is configured to occur multiple die at a time.

15. The method of claim 10 wherein a transfer process for transferring the plurality of die from the die source to the receive substrate includes at least one of an ablative process, a blistering process, a thermal release process, and a surface morphology change process for a surface of the die release material.

16. The method of claim 10 wherein the carrier includes a laser transmissive substrate for supporting a reactive layer and an adhesive layer.

17. The method of claim 10 wherein the carrier is a flexible freestanding carrier.

18. The method of claim 10 wherein the plurality of die are mini LEDs.

19. The method of claim 10 wherein the plurality of die are micro LEDs.

* * * * *